United States Patent [19]

Udagawa

[11] Patent Number: 5,323,488
[45] Date of Patent: Jun. 21, 1994

[54] MEMORY ACCESS METHOD AND CIRCUIT IN WHICH ACCESS TIMING TO A MEMORY IS DIVIDED INTO N PERIODS TO BE ACCESSED FROM N ACCESS REQUEST SOURCES

[75] Inventor: Yutaka Udagawa, Kawasaki, Japan

[73] Assignee: Canon Kabushiki Kaisha, Tokyo, Japan

[21] Appl. No.: 582,009

[22] Filed: Sep. 14, 1990

Related U.S. Application Data

[63] Continuation of Ser. No. 207,953, Jun. 17, 1988, abandoned.

[30] Foreign Application Priority Data

Jun. 24, 1987 [JP] Japan .................................. 62-155537
Jun. 26, 1987 [JP] Japan .................................. 62-157852

[51] Int. Cl.$^5$ .............................................. G06F 12/00
[52] U.S. Cl. ................................... 395/425; 395/800; 364/917.4; 364/930; 364/967; 364/967.4; 364/DIG. 2
[58] Field of Search ................ 395/425, 275, 325, 800; 358/261.1; 340/825.5

[56] References Cited

U.S. PATENT DOCUMENTS

| | | | |
|---|---|---|---|
| 4,017,841 | 4/1977 | Jensen | 395/325 |
| 4,454,575 | 6/1984 | Bushaw et al. | 395/325 |
| 4,491,916 | 1/1985 | Vallhonrat | 395/325 |
| 4,515,462 | 5/1985 | Yoneda | 355/326 |
| 4,515,487 | 5/1985 | Minami | 400/121 |
| 4,628,311 | 12/1986 | Milling | 340/825.5 |
| 4,630,193 | 12/1986 | Kris | 395/325 |
| 4,633,434 | 12/1986 | Scheuneman | 364/900 |
| 4,669,064 | 5/1987 | Ishimoto | 365/189.05 |
| 4,837,634 | 6/1989 | Hisada | 358/261.1 |
| 4,853,767 | 8/1989 | Sakai et al. | 358/78 |
| 4,931,815 | 6/1990 | Sato et al. | 346/154 |
| 4,949,247 | 8/1990 | Stephenson et al. | 395/800 |
| 5,060,145 | 10/1991 | Scheuneman et al. | 395/425 |

Primary Examiner—Robert B. Harrell
Assistant Examiner—Meng-Ai T. An
Attorney, Agent, or Firm—Fitzpatrick, Cella, Harper & Scinto

[57] ABSTRACT

An access circuit and method for accessing a single memory having a plurality of access request sources, in which a minimum access time of the memory is adopted as a unit time, a time corresponding to a minimum possible waiting time of each of the plurality of access request sources is adopted as one period, and the period is set as a set of the unit times. The one period is equally divided into divided times in accordance with the number of the access request sources, and each divided time is equally allocated to a corresponding one of the access request sources as an access time therefor. The memory is accessed by the access request sources at every access time allocated to the access request sources. Also provided is a printer apparatus which includes a writing circuit for writing color component data, which represents an image of a plurality of colors, in a single memory in compressed form, a reading circuit for reading color component data of different colors out of respective ones of different addresses of the single memory independently and at predetermined time units, a plurality of decoding circuits for decoding the color component data of each color read out by the reading circuit into corresponding color image data, and an image forming unit for reproducing a corresponding color image based on the image data of each color from the plurality of decoding circuits.

25 Claims, 6 Drawing Sheets

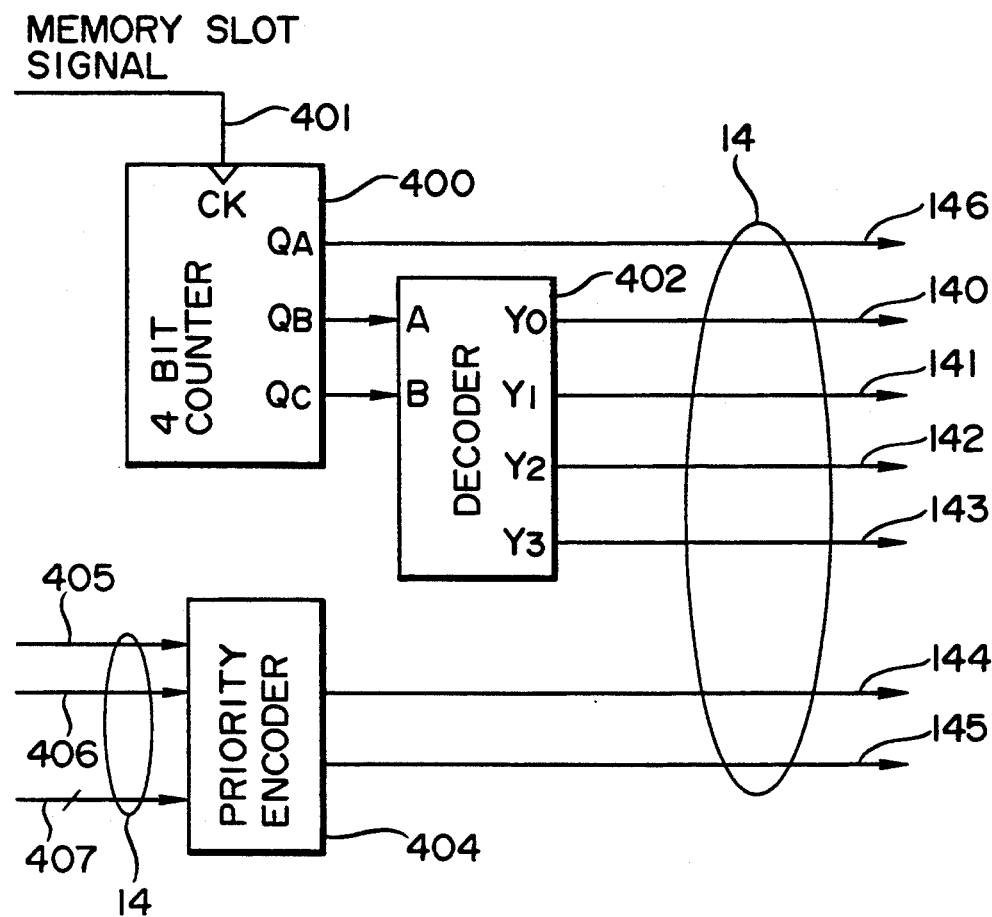
F I G. 4

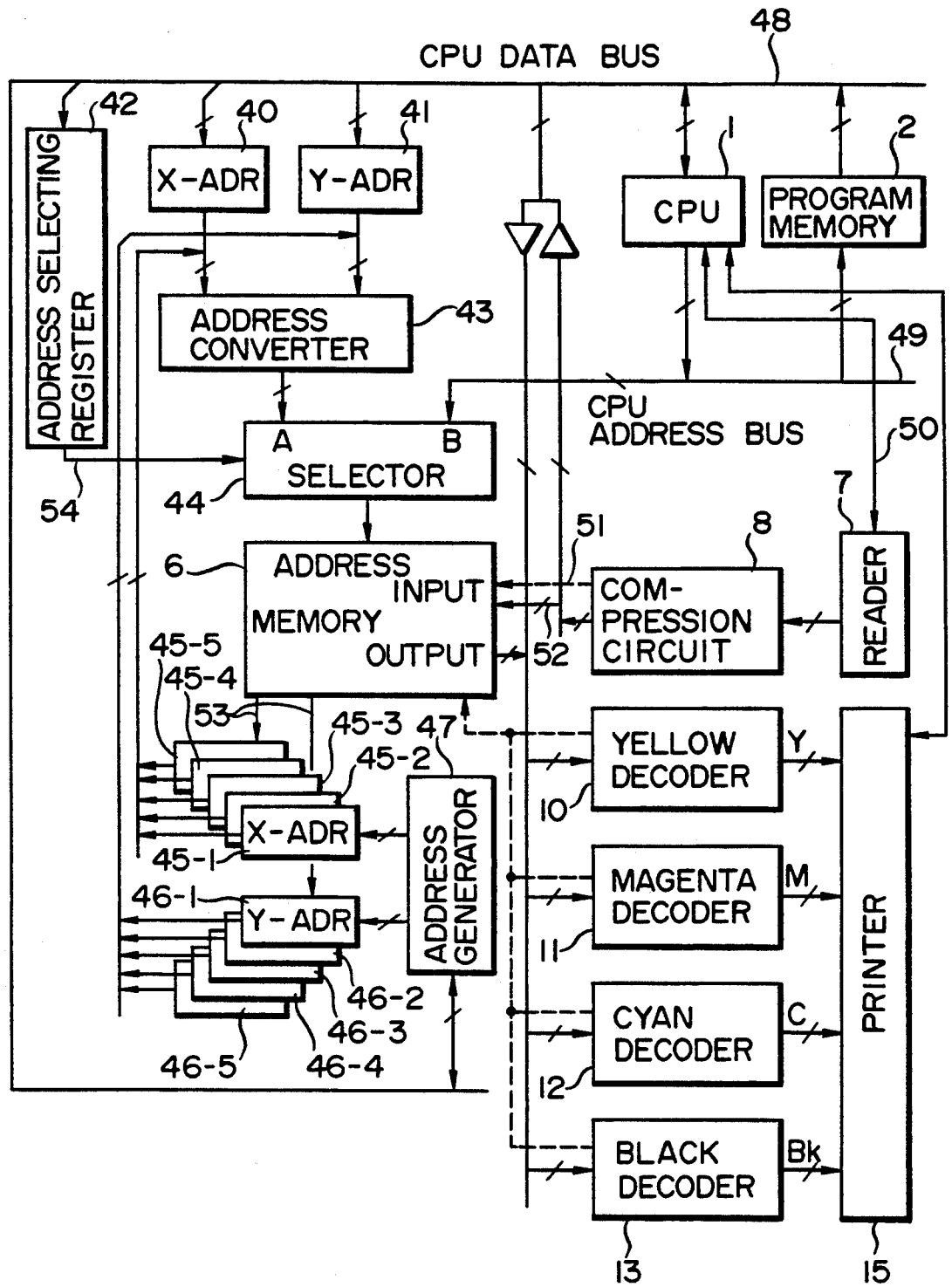
F I G. 5

MEMORY ACCESS METHOD AND CIRCUIT IN WHICH ACCESS TIMING TO A MEMORY IS DIVIDED INTO N PERIODS TO BE ACCESSED FROM N ACCESS REQUEST SOURCES

This application is a continuation of application Ser. No. 07/207,953, filed Jun. 17, 1988, now abandoned.

FIELD OF THE INVENTION

This invention relates to a method of accessing a memory capable of being accessed from a plurality of circuits and apparatuses, to a circuit for such memory access, and to a printer apparatus having such a circuit.

BACKGROUND OF THE INVENTION

When it is possible to generate a plurality of access requests for accessing a single memory, the conventional practice is to accomplish this by multiple accessing upon assigning a fixed order of priority to the sources that generate the individual access requests.

One disadvantage with the prior art is that a source generating an access request having a high order of priority continously monopolizes the memory, while the access request from a source having a low order of priority is hardly ever accepted. As a result, this source is made to wait an extremely long time for access to the memory.

Conventionally, a memory can be addressed in two ways. One method is to address the memory by means of a two dimensional address map, and the other is to employ a linear address such as an ordinary memory address. In the prior art, a CPU ordinarily is capable of addressing a memory using only one of these accessing methods.

Image data, by way of example, can be processed more efficiently by accessing an image memory using the two-dimensional addressing method. However, if it is desired to use a blank space in the image memory as a work area for the CPU, efficiency suffers since the address space of the CPU is a linear address.

Conversely, if a memory address is arranged in the form of a linear address to deal with the CPU address space, the efficiency of memory utilization is improved as seen from the CPU. However, if it is desired to address the memory as e.g. an image memory by means of a matrix, the efficiency of memory utilization declines.

In order to record a full-color image with an apparatus of the kind shown in FIG. 2, four-color data for the four colors Y, M, C and BL (black) is required. Furthermore, since the recording position for each color is different, it is required that the items of color data be supplied to the recording sections for these colors at different timings. Accordingly, an arrangement has been contemplated in which each item of color data is stored in a memory and these items of data are read out of the memory at an arbitrary timing.

However, in order to store the color data representing one sheet of a full-color image, one page of memory capacity is needed for each of the colors Y, M, C and BL, so that the image memory must have a total storage capacity of four pages. This raises a problem in terms of cost. To solve this problem, consideration has been given to an arrangement in which color data is stored upon being compressed in order to reduce the required memory capacity.

If the apparatus shown in FIG. 2 is so arranged that the images of the respective colors are recorded in separate time frames, as by recording the image data for the M color after recording of the image data for the Y color is completed, then the spacing between mutually adjacent recording positions for different colors must at least be made greater than the length of the recording paper. This would result in an apparatus of very large size. Accordingly, it has been contemplated to design an apparatus of compact size by making the spacing between mutually adjacent recording positions for different colors smaller than the length of the recording paper and recording an image on the recording paper at a succeeding recording position before the same recording paper has entirely left the immediately preceding recording position.

However, when it is attempted to reduce the size of the apparatus in this manner, a plurality of image memories corresponding to the various colors are required for storing the four-color image data compressed as mentioned above. These items of color data must be read out simultaneously and decoded, and different color data must be supplied to at least two recording sections simultaneously. Though the four-color image data are indeed compressed, a total of four pages of image memory must be provided, and it is necessary to also provide a plurality of memory control circuits capable of accessing these plural image memories.

SUMMARY OF THE INVENTION

An object of the present invention is to provide a memory access method and circuit in which memory access timing is divided at a predetermined period and allocated equally to each access request source, whereby each memory access request can be serviced equally.

Another object of the present invention is to provide a memory access method and circuit in which it is possible to designate whether the addressing of a memory by a CPU is performed by a two-dimensional address based on X and Y addresses or a linear address which is the address space of the CPU, whereby if the data processed is e.g. image data, the memory can be accessed by two-dimensional addressing to enable highly efficient use of the memory.

Still another object of the invention is to provide a memory access method and circuit which make it possible to utilize a memory efficiently and eliminate a long access waiting time caused by contention for memory access.

A further object of the invention is to provide a memory access method and circuit in which the addressing of a memory can be performed by a two-dimensional matrix or by linear addressing, thus making it possible to adopt an addressing method corresponding to the characteristics of the data.

Yet another object of the invention is to provide a printer apparatus in which memory capacity for image data is reduced and the apparatus is reduced in size and cost.

A further object of the invention is to provide a printer apparatus in which image data of different colors can be read out of a single memory in parallel, decoded and printed.

A further object of the invention is to provide a printer apparatus in which it is possible to eliminate waiting time for image memory readout caused by contention for readout of various color component data from the image memory, and in which the items of color component data can be decoded while being read out and a plurality of colors can be recorded simultaneously.

Yet another object of the invention is to provide a printer apparatus in which an image memory can be accessed by a one-dimensional or two-dimensional address, depending upon the image data.

Yet another object of the invention is to provide a printer apparatus in which it is possible to eliminate waiting time for image memory readout caused by contention for readout of various color component data from the image memory, a one-dimensional address or two-dimensional address is outputted for accessing the image memory depending upon the image data, and the items of color component data can be decoded while being read out and a plurality of colors can be recorded simultaneously.

According to the present invention, the foregoing objects are attained by providing a method of accessing a single memory having a plurality of access request sources, comprising the steps of: adopting a minimum access time of said single memory as a unit time, adopting a time corresponding to a minimum possible waiting time of each of said plurality of access request sources as one period, and setting said period as a set of said unit times; equally dividing said one period into divided times in accordance with the number of said access request sources, and equally allocating each divided time to a corresponding one of said access request sources as an access time therefor; and accessing said single memory by said access request sources at every access time allocated to said access request sources.

In another aspect of the invention, the foregoing objects are attained by providing a circuit for accessing a single memory having a plurality of access request sources, comprising: setting means, in which a minimum access time of said single memory is adopted as a unit time and a time corresponding to a minimum possible waiting time of each of said plurality of access request sources is adopted as one period, for setting said period as a set of said unit times; means for equally dividing said one period into divided times in accordance with the number of said access request sources, and equally allocating each divided time to a corresponding one of said access request sources as an access time therefor; and means for accessing said single memory by said access request sources at every access time allocated to said access request sources.

In another aspect of the invention, the foregoing objects are attained by providing a printer apparatus comprising: writing means for writing color component data, which represents an image of a plurality of colors, in a single memory in compressed form; reading means for reading color component data of different colors out of respective ones of different addresses of said single memory independently and at predetermined time units; a plurality of decoding means for decoding the color component data of each color read out by said reading means into corresponding color image data; and image forming means for reproducing a corresponding color image based on the image data of each color from said plurality of decoding means.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 4 is a block diagram illustrating the construction of a circuit for controlling order of priority;

FIG. 5 is a block diagram illustrating the general construction of a circuit for performing address conversion according to an embodiment of the invention.

DESCRIPTION OF THE PREFERRED EMBODIMENT

A preferred embodiment of the present invention will now be described in detail with reference to the accompanying drawings.

Figure 1:
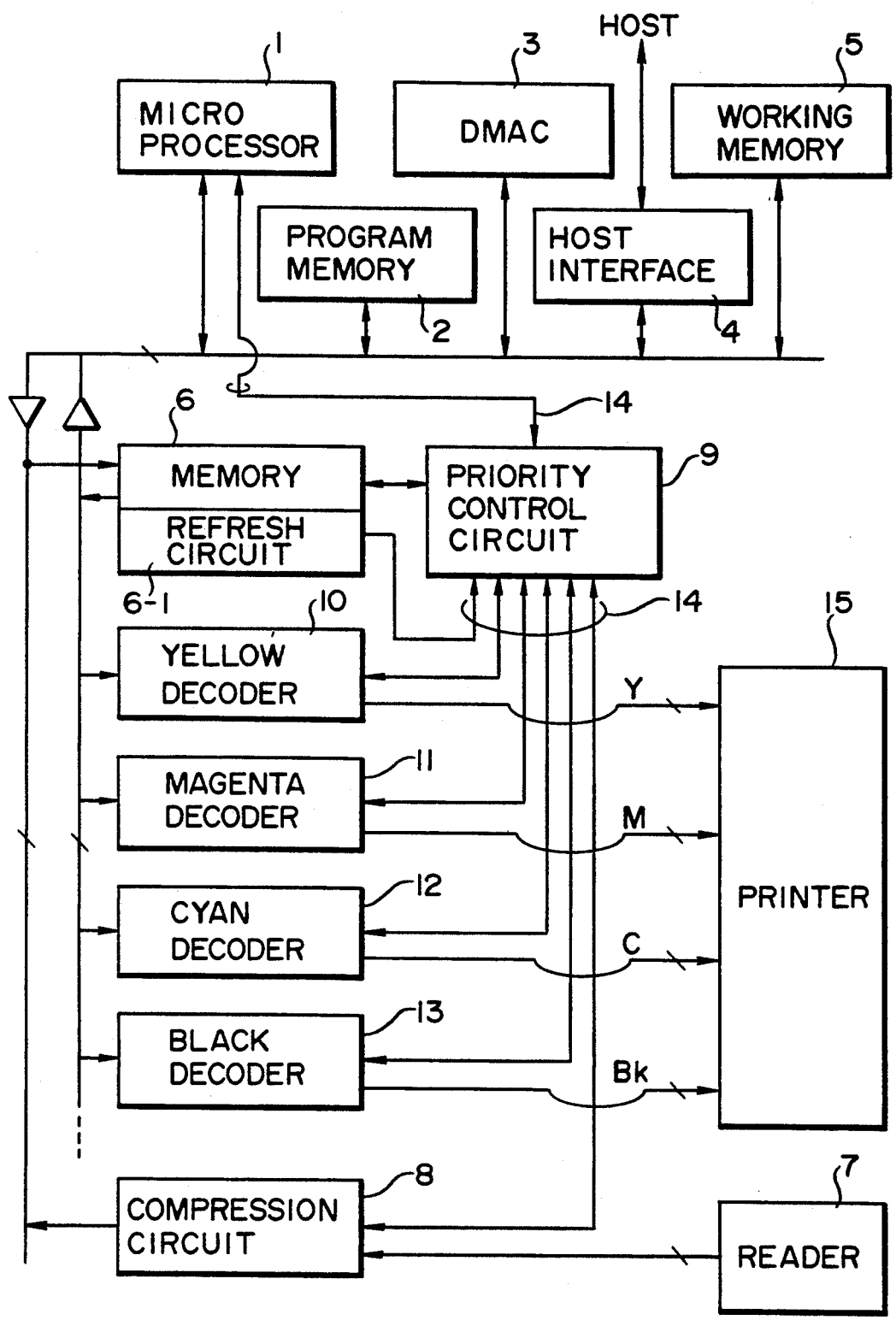
FIG. 1 is a block diagram illustrating the general construction of a copying machine embodying the present invention.

Description of image data processing section (FIG. 1)

FIG. 1 is a block diagram illustrating the general construction of an image data processing section in a copying machine embodying the invention.

With reference first to FIG. 1, a microprocessor 1 which operates in accordance with a control program stored in a program memory 2 executes overall control of the copying machine. A DMA controller (DMAC) 3 transfers print data between a working memory 5 or a memory 6 and a host interface 4. More specifically, the DMAC 3 transfers data from a host machine input via the host interface 4 to the memory 6, or sends data from the memory 6 or working memory 5 to the host machine. In this embodiment, the memory 6 is constructed as a dynamic RAM and includes a refresh circuit 6-1 by which the memory is refreshed at a fixed period.

A reader 7 is for reading a colored original document, converting color data of the three primary colors R, G and B and the color black into yellow, magenta, cyan and black data, and inputting the converted data to a compressing circuit 8. The latter compresses the yellow, magenta, cyan and black image signals from the reader 7 and transfers the compressed signals to the memory 6. A circuit 9 for controlling order of priority reads the image data of each color out of the memory 6, sends the data to decoder 10, 11 12 and 13 for the corresponding colors, and controls access to the memory 6, for purposes of memory refresh or the writing of data, in accordance with a predetermined order of priority. A control line 14 enables the priority control circuit 9 to control the decoders 10–13 and the microprocessor 1. The control line 14 carries request signals from the decoders 10–13, memory refresh circuit 6-1 and the like, as well as enable signals that enable operation of these circuits.

Encoded (compressed) image data of each color stored in memory 6 is decoded by the corresponding decoder and outputted to a printer 15. The latter performs colored printing upon receiving the yellow, magenta, cyan and black image data. The details of a recording section in the printer 15 are illustrated in FIG. 2.

Figure 2:
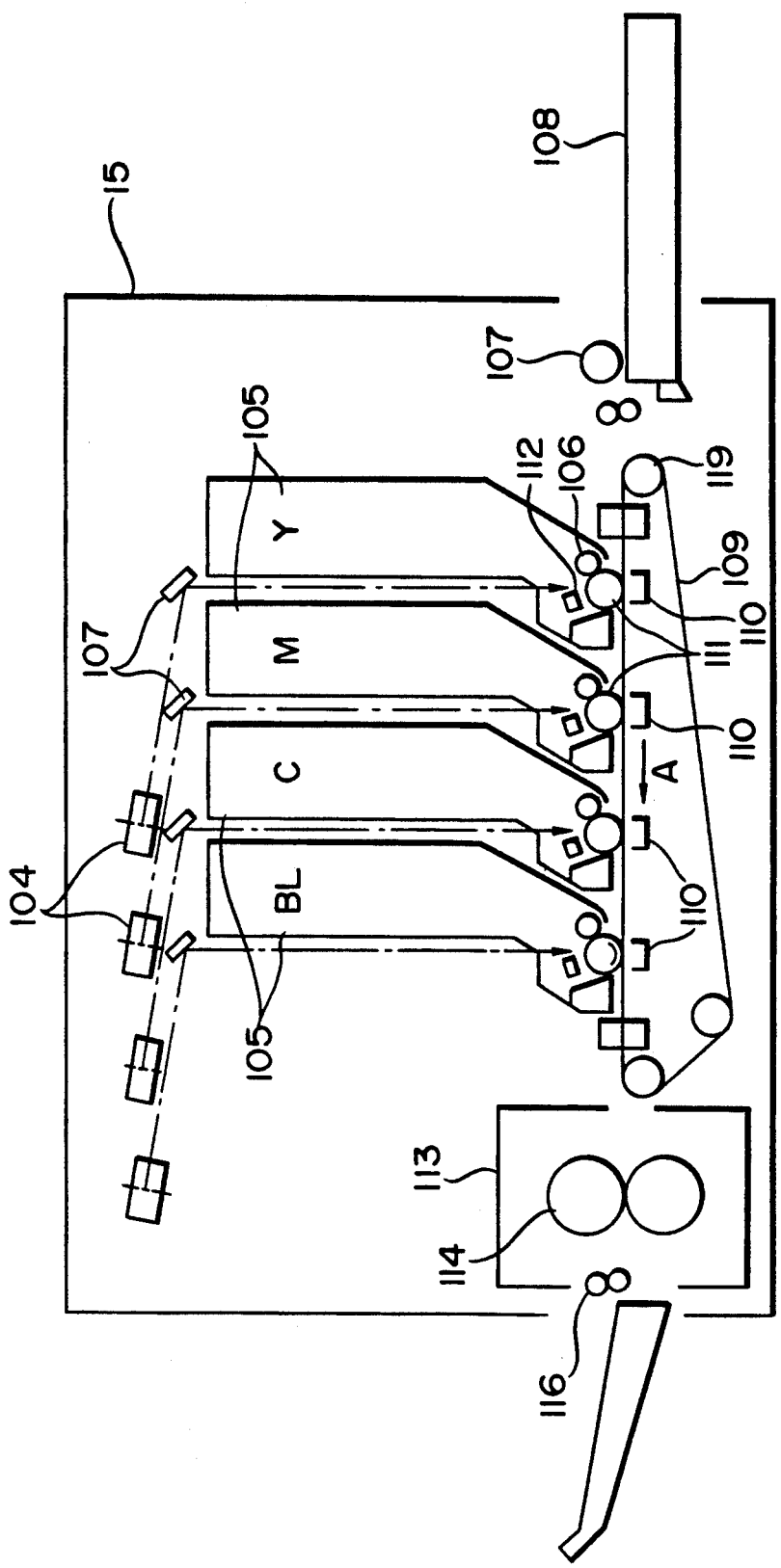
FIG. 2 is a view illustrating the general construction of a recording section in a printer.

Description of printer recording section (FIG. 2)

FIG. 2 is a view illustrating the general construction of a recording section in the printer 15 of this embodiment.

The recording section includes a cassette 108 for accommodating recording paper. The recording paper accommodated in the cassette 108 is conveyed by a paper feed roller 107 so as to be delivered to a conveyor belt 109. The latter conveys the recording paper in the direction of arrow A. Four photosensitive drums 111 are arranged at a predetermined spacing along the paper conveyance direction. In order to reduce the size of the machine, this drum spacing is made smaller than the length of the recording paper in the conveyance direction thereof. Accordingly, if the size of the recording paper used is A3, one sheet of this recording paper will engage all four of the drums 111.

Each one of the photosensitive drums 111 is provided with a charger 112, a toner hopper 105, a developing sleeve 106 and a transfer device 110. The colors of the toners contained in the toner hoppers 105 are arranged in the order of yellow, magenta, cyan and black, starting from the paper cassette 108. Each photosensitive drum 111 is further provided with an optical system including a laser oscillator, not shown, for generating a laser beam modulated by the applied image data, a polygonal mirror 104, and a reflector mirror 107. Each of these four units is uniformly charged by the corresponding charger 112 as the corresponding photosensitive drum 111 rotates in the direction of the arrow when recording is performed.

An electrostatic latent image corresponding to each color is formed on the corresponding photosensitive drum 111 by the laser light input by the respective polygonal mirror 104 and reflector mirror 107 and corresponding to the image data of each color. Since the four photosensitive drums 111 are arranged at a predetermined spacing, as mentioned above, the electrostatic latent image formed on each photosensitive drum 111 corresponds to the image at a position displaced by an amount equivalent to the drum spacing. Next, the toner corresponding to the electrostatic latent image is affixed to the surface of each drum by the corresponding developing sleeve 106, and the toner images of the four colors are formed in superposed fashion on the same sheet of recording paper which passes between the photosensitive drums 111 and opposing transfer devices 110. Thus, images are formed on the recording paper in the order of the colors yellow, magenta, cyan and black, and the recording paper is then delivered to a fixer 113. The toner image is fixed on the recording paper at the fixer 113 by means of heating rollers 114, after which the recording paper is discharged into a tray 115 by discharge rollers 116. In this way a full-color image based on the image data of each color stored in the memory 6 is printed on the recording paper.

Figure 3:
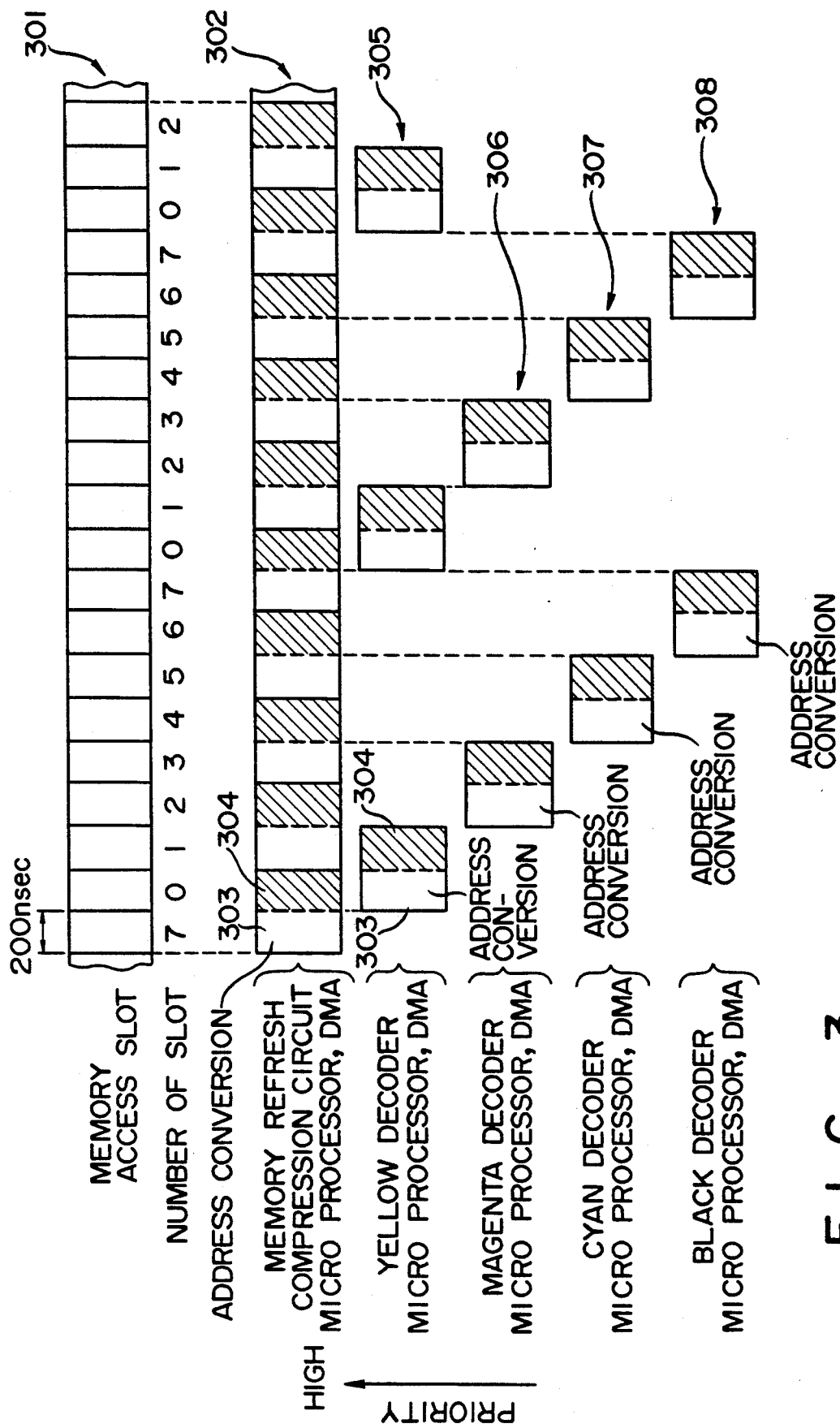
FIG. 3 is a view showing memory access slots and memory access timing according to an embodiment of the invention.

Description of memory accessing (FIG. 3)

FIG. 3 is a view for describing access timing for accessing the memory 6.

Numeral 301 denotes access slots output to the control circuit 9 from the memory 6. The cycle time of the access slots is 200 ns. The access rate of the memory 6 is such that a single read/write operation is terminated within one access slot. The control circuit 9 assigns the numbers "0" through "7" to the access slots, with eight slots constituting one cycle, allocates these access slots to the units that request access to the memory 6 (namely the decoders 10–13, the compressing circuit 8, the microprocessor, the DMAC, etc.), and controls access to the memory 6 based on the slot allocation and order of priority.

Numeral 302 denotes timing for refreshing the memory 6 and for accessing the memory 6 from the compressing circuit 8. Numeral 303 denotes timing for converting to the address of the memory 6, and numeral 304 denotes read/write timing regarding the memory 6. The access slots "0", "2", "4", "6" are allocated to the read/write timing 304. In accordance with the slots 302, memory refresh has the highest priority, then access to memory 6 by the compressing circuit 8, and then access to memory 6 by the microprocessor 1. Access to memory 6 by the DMAC 3 has the lowest priority.

In this embodiment, the request for refreshing of memory 6 is generated every 12 $\mu$s and is always executed. The write cycle for writing data into memory 6 by the compressing circuit 8 is 1.92 $\mu$s. Therefore, even if a write request regarding memory 6 comes into contention with the refresh timing for memory 6 in any of the access slots "0", "2", "4", "6", the writing of data into the memory 6 by the compressing circuit 8 is executable in the next access slot 400 ns later. Hence, no problems are encountered in terms of speed.

Numeral 305 denotes timing for access to the memory 6 by the yellow decoder 10, for which the access slots "0", "1" are allocated. Numeral 306 denotes timing for access to the memory 6 by the magenta decoder 11, for which the access slots "2", "3" are allocated. Numeral 307 denotes timing for access to the memory 6 by the cyan decoder 12 allocated to the access slots "4", "5". Numeral 308 denotes timing for access to the memory 6 by the black decoder 13 allocated to the access slots "6", "7". Thus, the four decoders are allocated access slots that differ from one another. Accordingly, there is no contention among the requests from the four decoders for access to the memory 6. Furthermore, since address conversion is executed independently at the access timing of each of the four decoders, each decoder is capable of commanding readout of the necessary image data from a different address of the memory 6 during one cycle (1.6 $\mu$s) of memory access.

If there is no memory access request from a decoder at the corresponding access timing, access to the memory 6 is executed by the microprocessor 1 or DMAC 3.

It should be noted that the read cycle of the memory 6 is decided by the printing speed of the printer 15. In this embodiment, the shortest read cycle is 1.92 $\mu$s. Furthermore, since the cycle time at which each decoder is capable of accessing the memory 6 is 1.6 $\mu$s in this embodiment, image data can be output without delay with respect to the printed speed of the printer 15.

The address conversion cycle 303 at each access timing is the cycle at which a matrix address of the memory 6 designated by X and Y is converted into a linear address, as will be described later. Since the address arrangement of memory 6 differs from the address configuration of the other circuits, conversion is executed every memory access timing.

It is apparent from FIG. 3 that the read/write timing 304 for reading and writing of data with respect to memory 6 by a decoder is generated between address conversion timings 303 of access timing 302. This is to arrange it so that there will be no contention between access to memory 6 by memory refresh or compressing circuit 8 having the highest order of priority, and access to memory 6 by the decoders 10-13, thereby making it possible for each decoder to assuredly access memory 6 in the cycle time of 1.6 μs.

FIG. 4 is a block diagram illustrating the general construction of the control circuit 9 for controlling the order of priority.

The control circuit 9 includes a four-bit counter 400 for counting memory slot signals (having a period of 200 ns) input thereto from the refresh circuit 6-1 of memory 6, and a decoder 402 for decoding the two higher order bits of counter 400 and outputting an enable signal to each of the decoders 10-13. In order that the four decoders 10-13 may each access the memory 6 equally at an access time of e.g. less than 1.92 μs, the arrangement is such that two access slots are allocated to each decoder and eight of the memory slot signals 401 are produced in 1 period (1.6 μs). Thus, each of the decoders can access the memory 6 equally. It goes without saying that the circuit arrangement can be suitably modified depending upon the number of circuits generating requests to access the memory 6, the minimum access cycle time requested, etc.

The control circuit further includes a priority encoder 404 to which are input a request signal 405 from the refresh circuit 6-1, a request signal 406 from the compressing circuit 8, and a request signal 407 from each of the decoder circuits 10-13, and which outputs an enable signal 144 to the compressing circuit 8, which has the second highest priority, and an enable signal 145 to the microprocessor 1, which has the lowest priority. The request signals 405-407 input to the priority encoder 404 are signals indicating that operation requests are output in the memory access slots designated by the corresponding circuits.

The enable signal 144 for enabling the compressing circuit 8 is output when the request signal 405 indicative of a refresh request from the memory refresh circuit 6-1 has not been output. An LSB signal 146 from counter 400 is input to the compressing circuit 8. In accessing the memory 6, address conversion is performed when signal 146 is logical "1" and accessing is executed when signal 146 is logical "0". The same is true for the refresh circuit 6-1, with address conversion being effected when signal 146 is logical "1" and the memory 6 being refreshed when signal 146 is logical "0". Numeral 145 denotes an enable signal delivered to the microprocessor 1. This signal is outputted to the microprocessor 1 as an operation-enable signal when a request has not been outputted by the memory refresh circuit 6-1, compressing circuit 8 and any of the decoders 10-13. Numeral 407 denotes a request signal from each of the decoders 10-13. This signal is outputted when each decoder outputs an operation request in the corresponding memory cycle.

Numeral 140 denotes an enable signal delivered to the yellow decoder 10, 141 an enable signal delivered to the magenta decoder 11, 142 an enable signal delivered to the cyan decoder 12, and 143 an enable signal delivered to the black decoder 13. These decoders 10-13 receive the corresponding enable signals and the LSB signal 146. When a decoder accesses the memory 6, the memory is accessed and data is read out when the signal 146 is logical "1", and the memory address conversion is executed when the signal 46 is logical "0". This is the opposite of the case where the compressing circuit 8 accesses the memory 6.

Address conversion of the memory 6 in the address conversion cycle will now be described.

Description of memory addressing method (FIG. 5)

FIG. 5 is a block diagram of a copying machine and is useful in describing the addressing of the memory 6 storing compressed image data. Though portions common with those of the foregoing embodiment are designated by like reference characters, the circuitry for controlling the order of priority is deleted in order to simplify the drawings.

First, with regard to the reading and inputting of a manuscript image, the microprocessor (CPU) 1 applies a read start command to the reader 7 via a control line 50 and instructs an address generator 47 of offset values of a write address for memory 6 and of an address update sequence for an X address section 45 and Y address section 46 via a data bus 48. The CPU 1 also sets a changeover signal 54 of a selector 44 in an address selecting register 42. When the changeover signal 54 is logical "1", for example, the A input (two-dimensional address) of the selector 44 is selected. In response, the selector 44 selects an address signal from an address converter 43 and outputs the address to the memory 6.

When the image data from the reader 7 is inputted to the compressing circuit 8, a transfer request is sent to the memory 6 via a control line 51. At this time offset values of the X and Y addresses are set in the address generator 47 in response to control exercised by the CPU 1. A two-dimensional address from an X address output unit 45-1 and Y address output unit 46-1 are converted into a linear address by the address converter 43, and the linear address is outputted through the selector 44 as the address of memory 6. When a transfer enable signal is sent from the memory 6 to the compressing circuit 8 via a signal line (not shown), the compressing circuit 8 transfers one word of compressed image data to the memory 6 via a bus 52. As a result, a one-word write signal 53 from memory 6 is inputted to the X address output unit 45-1 and the Y address output unit 46-1 to update the respective addresses. It should be noted that, under the instruction the CPU 1, the address generator 47 performs such control as setting of the offset values of the X and Y addresses and interchanging of the X and Y addresses to rotate the image data by 90°.

Accessing of the memory 6 by the CPU 1 will now be described.

In a case where the CPU 1 accesses the memory 6 by using a two-dimensional address (X and Y addresses), the CPU 1 causes the address selecting register 42 to set the changeover signal 54 to logical "1" so that the A terminal of the selector 44 will be selected. X and Y addresses constituting a two-dimensional address are then set in X and Y addresses 40, 41, respectively. These X and Y addresses are converted into a linear address of memory 6 by the address converter 43, and the linear address is applied to the A input of the selector 44.

Meanwhile, address data (a linear address) on an address bus 49 (24 bits) of CPU 1 remains connected to a B input of the selector 44. Accordingly, when the changeover signal 54 is set to logical "0" so that the selector 44 selects is B input, the address space of the memory 6 is included as a portion of the address space of CPU 1, and it becomes possible for the CPU 1 to access the memory 6 by using a linear address. Thus, in accessing the memory 6, the CPU 1 is capable of selecting a two-dimensional address or a linear address.

In a case where image data from the memory 6 is decoded by the decoder circuits 10-13 and delivered to the printer 15, offset values of the X and Y addresses are set in the address generator 47 under the instruction of the CPU 1, as in the case of the compressing circuit 8, and a two-dimensional address is formed from X address output units 45-2, 45-3, 45-4, 45-5 and Y address output units 46-2, 46-3, 46-4, 46-5 provided for corresponding ones of the decoders. After a conversion is made to a linear address by the address converter 43, the linear address is outputted to the memory 6 via the selector 44.

Figure 6:
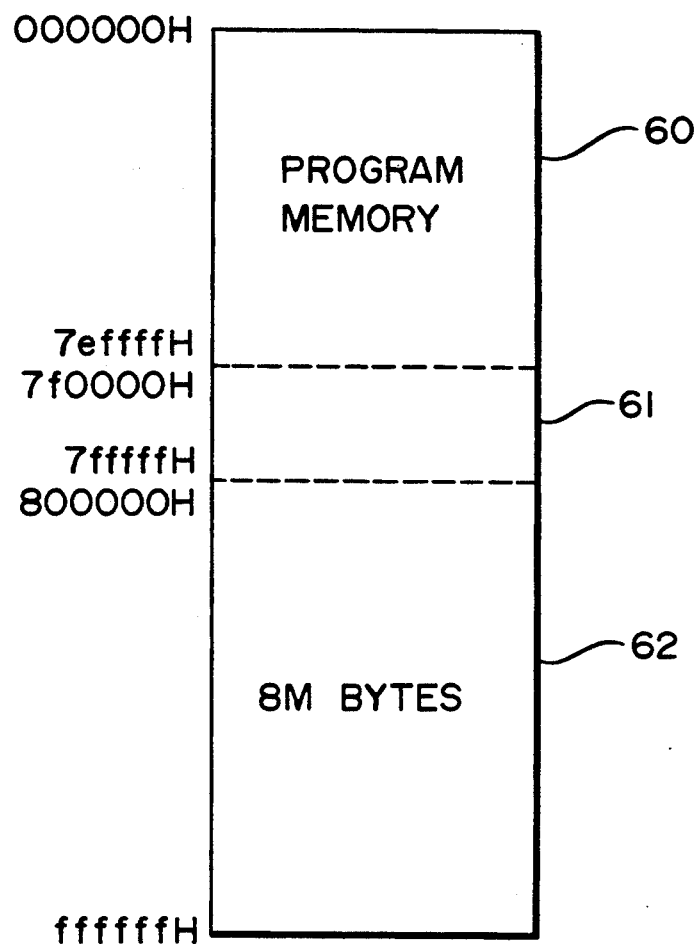
FIG. 6 is a view showing a linear address space of a CPU.

FIG. 6 is a view illustrating the a linear address space of the CPU 1. The address space of the memory 6 is 800000H - FFFFFFH (where H is a hexadecimal number)

Numeral 60 denotes an address space of the program memory 2, and numeral 61 an address space of an input-/output port, the address space containing the X address 40, the Y address 41, an output address for the address generator 47, etc. Numeral 62 denotes an 8 megabyte address space of memory 6.

In a case where the memory 6 is accessed by using a two-dimensional address, the X address and Y address of the memory 6 are set in 40, 41, respectively, and a signal for selecting the A input of the selector 44, to which the linear address from the address converter 43 is applied, is set in the address selecting register 42.

When the memory 6 is accessed using the two-dimensional address, the address signal of the memory 6 passes through the address converter 43 and, hence, the access time is longer than that needed for accessing using a linear address. However, in order to facilitate control, a dummy address conversion time is applied in the case of the linear address so that the same access time will be required regardless of which accessing speed prevails.

The changeover signal 54 from the address selecting register 42 becomes logical "0" only when the memory 6 is accessed from the CPU 1, and reverts to logical "1" when the compressing circuit 8 or any of the decoder circuits 10-13 access the memory 6, thereby selecting the A input of the selector 44 so that an X, Y two-dimensional map address is selected.

In the present embodiment, the circuits 40, 41 possess automated incrementing and decrementing functions. When the memory 6 is accessed by the two-dimensional map, either or both of the X and Y addresses can be incremented or decremented by hardware at the moment that accessing of memory 6 is completed.

For example, assume a case where the number of dots in the main scanning direction of the reader 7 is 1500 (not a power of 2) as when image data are inputted from the reader 7. If the count of X addresses 40 is mod 1500 and it is arranged so that the Y address 41 is incremented by +1 whenever "1500" of the X addresses 40 is counted, the image data from the reader 7 will be stored in the memory 6 efficiently. Efficiency in a case where the memory 6 is accessed continuously is improved.

The present embodiment relates to a case where print data for each color of a laser printer is read out or transferred. However, the invention is not limited to such an embodiment and can be applied to all cases where it is possible for a plurality of circuits and apparatus to simultaneously access a single memory.

Thus, in accordance with the foregoing embodiment, a two-dimensional map address mode and a linear address mode can be used when a CPU or various apparatus access a memory.

Further, in accordance with the foregoing embodiment, the quantity of image data after compression is fixed, irrespective of the type of image, since a fixed length image data compression method is employed. Accordingly, in a case where there is extra storage space in a memory, a portion of the memory can be effectively utilized as a CPU working memory in accordance with the linear address mode.

Further, in accordance with the foregoing embodiment, memory access timing is time-shared and a prescribed circuit access timing is allocated to a time-shared predetermined timing, thereby making multiple accessing possible. Owing to the arrangement of the embodiment, moreover, an output can be delivered to a printer simultaneously while a manuscript is being read in by a reader. This makes it possible to raise printing speed.

As many apparently widely different embodiments of the present invention can be made without departing from the spirit and scope thereof, it is to be understood that the invention is not limited to the specific embodiments thereof except as defined in the appended claims.

What is claimed is:

1. A method of accessing a memory having N access request sources, N being a predetermined positive integer, comprising the steps of:

adopting a minimum access time of the memory as a unit time, adopting a time corresponding to a minimum possible waiting time of each of the N access request sources as one period, and setting the one period as an integral multiple of the unit time;

equally dividing the one period into N divided times, and equally allocating each of the N divided times to a corresponding one of the access request sources as a respective access time therefor;

selecting whether or not an address supplied to said memory is to be converted; and accessing the memory by each of the N access request sources at every respective access time allocated to each of the access request sources.

2. A method according to claim 1, wherein when each of the N request sources is allocated its respective access time, access requests of each of the access request sources are assigned an order of priority, and the access request sources access the memory in accordance with the order of priority.

3. A method according to claim 1, wherein the memory can be accessed by a one-dimensional address or by a two-dimensional address comprising an X address and a Y address, and when access is requested at the respective access time, a corresponding one of the access request sources sets an address for the single memory to the one-dimensional address or the two-dimensional address and then accesses the memory.

4. A method according to claim 1, wherein the respective access time each include a time equivalent to first and second time segments, each of the first and second time segments being equal to the unit time, and each of the access request sources performs an address conversion at the first time segment and access said memory at the second time segment.

5. A circuit for accessing a memory having N access request sources, N being a positive integer, said circuit comprising:

a control circuit for inputting a memory minimum access time signal of the memory, in which a minimum access time of the memory is adopted as a unit time and a time corresponding to a minimum possible waiting time of each of said N access request sources is adopted as one period, wherein said control circuit is for setting the one period as an integral multiple of the unit time; and assigning means for equally dividing one period input from said control circuit, into N divided times, and equally allocating each of the N divided times to a corresponding one of said access request sources as a respective access time therefor, wherein each of said request sources accesses said memory at every respective access time allocated by said assigning means, said respective access time corresponding to a kind of information stored in said memory.

6. A circuit according to claim 5, further comprising a priority circuit for assigning an order of priority to each of said access request sources when each of said N access request sources are allocated its respective access time, and each of said access request sources accesses said memory in accordance with the order of priority.

7. A circuit according to claim 5, wherein the respective access time each includes a time equivalent to at least first and second time segments each of the time segments being equal to the unit time, and each of said access request sources performs an address conversion at the first time segment and accesses said memory at the second time segment.

8. A circuit for accessing a memory having N access request sources, N being a positive integer, said circuit comprising:
  a control circuit for inputting a memory minimum access time signal of the memory, in which a minimum access time of the memory is adopted as a unit time and a time corresponding to a minimum possible waiting time of each of said N access request sources is adopted as one period, wherein said control circuit is for setting the one period as an integral multiple of the unit time;
  assigning means for equally dividing one period input from said control circuit, into N divided times and equally allocating each of the N divided times to a corresponding one of said access request sources as a respective access time therefor, wherein each of said request sources accesses said memory at every respective access time allocated by said assigning means;
  first accessing means for accessing the memory by a linear one-dimensional address; and
  second accessing means for accessing the memory by a two-dimensional address comprising an X address and Y address, wherein each of said access request sources have selecting means for selecting an address output to the memory from said first accessing means or said second accessing means.

9. A printer apparatus comprising:
  writing means for writing plural color component data, which represent an image of a plurality of colors, in a memory at respective addresses in compressed form;
  reading means for reading the plural color component data written in the memory by said writing means, out of respective different addresses of said memory independently and at predetermined time units;
  N decoding means, N being a positive integer, for decoding respective color data of the plural color component data read out by said reading means into corresponding color image data; and
  image forming means for reproducing a corresponding color image based on each of said color image data from said N decoding means.

10. A printer apparatus according to claim 9, wherein said writing means converts each of the respective addresses of the memory at a minimum access time of the memory, and writes the plural color component data at a succeeding minimum access time.

11. A printer apparatus according to claim 9, wherein said writing means comprises:
  first accessing means for accessing the memory by a linear one-dimensional address;
  second accessing means for accessing the memory by a two-dimensional address comprising an X address and Y address; and
  selecting means for selecting an address output to the memory from said first accessing means or said second accessing means.

12. A printer apparatus according to claim 9, wherein said reading means has means for adopting a minimum access time of the memory as a unit time, setting a time corresponding to a minimum possible waiting time of each of said decoding means as one period, the one period comprising time which is a whole-number multiple of the unit time, equally dividing the one period into N divided times, and allocating the predetermined time units to each of said decoding means as access times of said decoding means.

13. A printer apparatus according to claim 9, wherein said reading means comprises:
  first accessing means for accessing the memory by a linear one-dimensional address;
  second accessing means for accessing the memory by a two-dimensional address comprising an X address and Y address; and
  selecting means for selecting an address output to the memory from said first accessing means or said second accessing means.

14. A printer apparatus according to claim 12, wherein said reading means accesses the memory while said writing means is performing address conversion in the predetermined time units, and performs conversion of an address output to the memory while said writing means is writing data in the memory.

15. A printer apparatus according to claim 12, wherein said minimum possible waiting time is decided by a printing speed of said image forming means.

16. The printer apparatus according to claim 12, further comprising a plurality of read sources wherein said plurality of read sources and said decoding means are allocated to said predetermined time units, an order of priority is assigned to each of access requests of said plurality of read sources, and each of said read sources reads data out of said memory in accordance with the order of priority.

17. A printer apparatus according to claim 16, wherein each of said N decoding means is one of said plurality of read sources, and each of said decoding means has a priority of highest order in each of the predetermined time units.

18. A printer apparatus comprising:
  a memory for storing compressed color image data including N color component data, N being a positive integer;
  image forming means having N color recording units, for printing original color image based on N color component image data;

reading means for reading out N compressed color image data from said memory; and N decoding means for decoding each of the N compressed color image data read out by said reading means, and for generating N color component image data, each of which is printed by each of said N color recording units, wherein said reading means reads each of the N compressed color image data out of respective ones of different addresses of said memory at predetermined time units.

19. A printer apparatus according to claim 18, further comprising writing means for writing each of the compressed color image data into said memory at different addresses.

20. A printer apparatus according to claim 18, wherein the N color component image data comprises yellow, magenta, cyan and black image data, and wherein said N color recording units comprise yellow, magenta, cyan and black recording units.

21. A printer apparatus according to claim 18, wherein said reading means reads the N compressed color image data in sequence in accordance with an arrangement of said N color recording units.

22. A printer apparatus comprising:
a memory for storing compressed color image data including N color component data, N being a positive integer;

image forming means having N color recording units, for printing original color image based on N color component image data;

reading means for reading out N compressed color image data from said memory; and N decoding means for decoding each of the N compressed color image data read out by said reading means, and for generating N color component image data, each of which is printed by each of said N color recording units, wherein said reading means reads each of the N compressed color image data at predetermined time units, out of respective ones of different addresses of said memory in a predetermined order.

23. A printer apparatus according to claim 22, further comprising writing means for writing each of the compressed color image data into said memory at different addresses.

24. A printer apparatus according to claim 22, wherein the N color component image data comprises yellow, magenta, cyan and black image data, and wherein said N color recording units comprise yellow, magenta, cyan and black recording units.

25. A printer apparatus according to claim 22, wherein said reading means reads the N compressed color image data in sequence in accordance with an arrangement of said N color recording units.

* * * * *

UNITED STATES PATENT AND TRADEMARK OFFICE
CERTIFICATE OF CORRECTION

PATENT NO. : 5,323,488

DATED : June 21, 1994

INVENTOR(S) : YUTAKA UDAGAWA

It is certified that error appears in the above-identified patent and that said Letters Patent is hereby corrected as shown below:

COLUMN 1

Line 31, "two dimensional" should read --two-dimensional--.
Line 39, "desired" should read --is desired--.
Line 46, "as e.g." should read --as, e.g.,--.

COLUMN 2

Line 41, "is e.g." should read --is, e.g.,--.

COLUMN 4

Line 51, "decoder 10, 11 12" should read
--decoders 10, 11, 12--.

COLUMN 6

Line 54, "printed" should read --printing--.

COLUMN 7

Line 14, "of e.g." should read --of, e.g.,--.
Line 64, "signal 46" should read --signal 146--.

COLUMN 8

Line 40, "instruction the" should read --control of the--.

COLUMN 10

Line 56, "access time each" should read
--access times each--.
Line 60, "access" should read --accesses--.

UNITED STATES PATENT AND TRADEMARK OFFICE
CERTIFICATE OF CORRECTION

PATENT NO. : 5,323,488
DATED : June 21, 1994
INVENTOR(S) : YUTAKA UDAGAWA

It is certified that error appears in the above-identified patent and that said Letters Patent is hereby corrected as shown below:

COLUMN 12

Line 48, "The" should read --A--.

Signed and Sealed this

Fifteenth Day of November, 1994

Attest:

BRUCE LEHMAN

Attesting Officer

Commissioner of Patents and Trademarks